(12) United States Patent
Xu et al.

(10) Patent No.: US 9,026,413 B2
(45) Date of Patent: May 5, 2015

(54) THERMODYNAMIC PHASE EQUILIBRIUM ANALYSIS BASED ON A REDUCED COMPOSITION DOMAIN

(71) Applicant: Invensys Systems, Inc., Foxboro, MA (US)

(72) Inventors: Gang Xu, Irvine, CA (US); David Bluck, Yorba Linda, CA (US)

(73) Assignee: Invensys Systems, Inc., Foxboro, MA (US)

( * ) Notice: Subject to any disclaimer, the term of this patent is extended or adjusted under 35 U.S.C. 154(b) by 336 days.

(21) Appl. No.: 13/623,203

(22) Filed: Sep. 20, 2012

(65) Prior Publication Data

US 2014/0081607 A1 Mar. 20, 2014

Related U.S. Application Data

(62) Division of application No. 12/560,134, filed on Sep. 15, 2009, now Pat. No. 8,364,316.

(51) Int. Cl.
*G06G 7/48* (2006.01)
*G06F 17/50* (2006.01)

(52) U.S. Cl.
CPC .................................. *G06F 17/5009* (2013.01)

(58) Field of Classification Search
None
See application file for complete search history.

(56) References Cited

U.S. PATENT DOCUMENTS

2011/0054871 A1 3/2011 Xu et al.

OTHER PUBLICATIONS

Lowri Davies, George Jackson, Luis Rull Closed-Loop Phase Equilibria of a Symmetrical Associating Mixture of Square-Well Molecules Examined by Gibbs Ensemble Monte Carlo Simulation Physical Review E, vol. 61, No. 3, Mar. 2000.*
Conor McDonald, Christodoulos Floudas GLOPED: A New Computational Tool for the Phase and Chemical Equilibrium Problem Department of Chemical Engineering, Princeton University, Aug. 25, 1995.*
Gang Xu, Joan Brennecke, Mark Stadtherr Reliable Computation of Phase Stability and Equilibrium from the SAFT Equation of State Ind. Eng. Chem. Res. 41, pp. 938-952, 2002.*
Gang Xu, Aaron Scurto, Marcelo Castier, Joan Brennecke, Mark Stadtherr Reliable Computation of High Pressure Solid-Fluid Equilibrium Department of Chemical Engineering, University of Notre Dame, Oct. 1999.*
PCT International Search Report regarding PCT/US2010/046888 dated Apr. 28, 2011, 3 pages.
Written Opinion of the International Searching Authority regarding PCT/US2010/046888 dated Apr. 28, 2011, 4 pages.

(Continued)

*Primary Examiner* — Omar Fernandez Rivas
*Assistant Examiner* — Cuong Luu
(74) *Attorney, Agent, or Firm* — Thomas J. Roth, Esq.

(57) ABSTRACT

A method of modeling phase characteristics of thermodynamic systems utilizing pseudo-properties strategy and a reduced number of variables is disclosed herein. The method describes a means of determining the probability of phase splitting of mixtures of materials at a given temperature, pressure, and composition by characterizing the functions that describe the system via pseudo-properties, and also by describing the system in n−1 or fewer variables, where n represents the number of components in the system of interest. In an embodiment, a multi-component system is characterized in one variable, thereby providing simplified thermodynamic models in a time-efficient manner. In addition, the information generated by this reduced-variable calculation can further be used as a starting point for calculations of equations of state.

14 Claims, 3 Drawing Sheets

(56) References Cited

OTHER PUBLICATIONS

Ursula R. Kattner, "The thermodynamic modeling of multicomponent phase equilibria", JOM Journal of the Minerals, Metals and Materials Society, vol. 49, No. 12, 1997, pp. 14-19. Nov. 12, 1997.

S.H.Zhou et al., "Phase equilibria and thermodynamic limits for partitionless crystallization in the Al—La binary system", Acta Materialia, vol. 54, Issue 3, pp. 831-840, Feb. 28, 2006.

Arthur D. Pelton, "Thermodynamic modeling and phase equilibrium calculations in nuclear materials", Pure & Appl. Chem. vol. 69, No. 11, 1997, pp. 2245-2252, Nov. 30, 1997.

Jeong Won Kang et al., "Applications of Molecular Modeling Method for Thermophysical Properties Estimations", Prospectives of Industrial Chemistry, vol. 9, No. 1, 2006, pp. 41-52, Jan. 30, 2006.

Mathias, P.M., et al., "Effective Utilization of Equations of State for Thermodynamic Properties in Process Simulation", AIChE Journal, vol. 30, No. 2 p. 182-186, Mar. 1984.

* cited by examiner

THERMODYNAMIC PHASE EQUILIBRIUM ANALYSIS BASED ON A REDUCED COMPOSITION DOMAIN

CROSS-REFERENCE TO RELATED APPLICATION

This application is a divisional of U.S. Ser. No. 12/560,134, filed Sep. 15, 2009, the entire contents of which are incorporated herein by reference.

STATEMENT REGARDING FEDERALLY SPONSORED RESEARCH OR DEVELOPMENT

Not applicable.

REFERENCE TO A MICROFICHE APPENDIX

Not applicable.

BACKGROUND

In the drive for ongoing improvements in operating efficiency, industrial plants such as chemical plants, refineries, food processing plants, pharmaceutical plants, breweries, and other batch and continuous plant systems may employ computer-based modeling and simulation to optimize plant operations. These modeling systems are typically used to simulate plant processes by defining components and equipment of plants in computer models and then using mathematical computations to project or reveal the behavior of these systems as relevant parameters vary.

This type of modeling may be used to aid in the design and operation of such plants, as well as to provide computer-based training of operators by simulating plant and process responses to variations that can arise in real-world situations without the hazards or costs associated with subjecting plants to these events. In addition, predictions can be made about plant behavior in order to devise tactics for handling such events, should they occur. This type of modeling can also be used to assist in controlling plant operations by predicting system changes and responding accordingly by tying the information produced by the models into control loops of plant equipment.

Modeling of these systems typically involves iterative calculations of complex thermodynamic equations in order to accurately describe static views of dynamic systems. Given the rapidly changing state of these systems and the limitation of only being able to calculate discrete moments in time, this form of modeling can place heavy demands on a computer's central processing unit (CPU) as constant recalculations are required to keep the model updated. This heavy processing load challenges the ability to provide accurate data with sufficient speed to obtain predictive models in time to proactively forestall critical situations, thereby rendering plant control in a real world application difficult or impossible.

SUMMARY

In an embodiment, a method is provided. The method comprises a processor determining a value of a tangent hyperplane distance function $D(\alpha)$ defined on a composition domain having k dimensions, where $1 \leq k < n$, for a material mixture having a composition $\bar{z}$ comprised of n components having a mole fraction $\{z_1, z_2, \ldots, z_n\}$. The processor is in communication with a memory, and the memory stores a thermodynamic modeling application. Determining the value of the tangent hyperplane distance function is based on the processor executing the thermodynamic modeling application. The method also comprises the processor evaluating a phase stability of the material mixture, where the material mixture is determined to be susceptible to a phase split when $D(\alpha) < 0$.

In an embodiment, a system is provided. The system comprises a computer system, a memory, a thermodynamic process simulation application, and a thermodynamic equilibrium application. The thermodynamic process simulation application and the thermodynamic equilibrium application are stored in the memory. When executed by the computer system, the thermodynamic equilibrium application estimates the probability that a material mixture at a specified temperature, a specified pressure, and having a specified feed composition $\bar{z}$ comprised of n components having a mole fraction $\{z_1, z_2, \ldots, z_n\}$ is split into at least two phases based on evaluating a tangent hyperplane distance function in a variable $\bar{x} = \{x_1, x_2, \ldots, x_n\}$ representing the mole fraction of the material mixture in a second state by reducing the order of the tangent hyperplane distance function by substituting $\alpha$ comprised of from 1 variable to n−1 variables. The thermodynamic process simulation application executes on the computer system and invokes the thermodynamic equilibrium application to determine a result based on the probability that the material mixture is split into at least two phases determined by the thermodynamic equilibrium application. The system at least one of controls a thermodynamic process, controls a thermodynamic process control component, trains an operator of the thermodynamic process, trains an operator of the thermodynamic process control component, and predicts the failure time of a process control component based on the result determined by the thermodynamic process simulation application.

In an embodiment, a system is disclosed. The system comprises a computer system, a memory, a thermodynamic process simulation application, and a thermodynamic equilibrium application. The thermodynamic process simulation application and the thermodynamic equilibrium application are stored in the memory. When executed by the computer system, the thermodynamic equilibrium application estimates the probability that a material mixture at a specified temperature, a specified pressure, and having a specified feed composition $\bar{z}$ comprised of n components having a mole fraction $\{z_1, z_2, \ldots, z_n\}$ is split into at least two phases based on evaluating an equation $\Psi(\alpha)$, where $\alpha$ is a scalar variable, and where $\alpha_z$ is a value of $\alpha$ corresponding to the specified feed composition $\bar{z}$ $$D = \alpha + \sum_{i=1}^{n} f_i(\alpha) \ln[f_i(\alpha)] - g_{mix}(z) - \sum_{i=1}^{n} \{f_i(\alpha) - z_i\} \frac{\partial g_{mix}}{\partial \alpha_z} \quad (\Psi(\alpha))$$

to determine if D has a negative value for some value of $\alpha \neq \alpha_z$. In equation ($\Psi(\alpha)$), $g_{mix}(\ )$ is the Gibbs energy of mixing function at the specified temperature and specified pressure, where $f_i(\alpha_z) = z_i$, where $f_i(\alpha)$ is determined as a Taylor Series approximation of the form $$\sum_{j=0}^{m} f_i^j(\alpha_z) \frac{(\alpha - \alpha_z)^j}{j!},$$

and where m is an integer. The thermodynamic process simulation application executes on the computer system and invokes the thermodynamic equilibrium application to determine a result based on the probability that the material mixture is split into at least two phases determined by the thermodynamic equilibrium application. The system at least one of controls a thermodynamic process, controls a thermodynamic process control component, trains an operator of the thermodynamic process, trains an operator of the thermodynamic process control component, and predicts the failure time of a thermodynamic process control component based on the result determined by the thermodynamic process simulation application.

In an embodiment, a method is disclosed. The method comprises a processor determining a value of a tangent hyperplane distance function $D(\alpha)$ defined on a composition domain having k dimensions, where $1 \leq k < n$, for a material mixture having a composition $\bar{z}$ comprised of n components having a mole fraction $\{z_1, z_2, \ldots, z_n\}$ of the material mixture in a first phase. The processor is in communication with a memory, the memory storing a thermodynamic modeling application, and determining the value of the tangent hyperplane distance function is based on the processor executing the thermodynamic modeling application. The method further comprises the processor evaluating a phase stability of the material mixture, where the material mixture is determined to be susceptible to a phase split when $D(\alpha)<0$ and determining a thermodynamic property of the material mixture in a first phase from an equation of state of the material mixture in the first phase based at least in part on $\bar{z}$. When $D(\alpha)<0$, the method further comprises determining a thermodynamic pseudo-property of the material mixture in a second phase from the equation of state of the material mixture in the second phase based at least in part on a mole fraction $\bar{x} = \{x_1, x_2, \ldots, x_n\}$ of the material mixture in the second phase, using $\alpha$ to determine $\bar{x} = \{x_1, x_2, \ldots, x_n\}$ based on a relation $$x_i \propto \left[z_i + (\alpha - \alpha_i)\frac{1}{\ln \phi_i^z}\right] \text{ where } \alpha_z = \sum_{i=1}^{n} z_i \ln \phi_i^z$$

and where $\phi_i^z$ is the fugacity coefficient of the i-th mixture component at the specified temperature, at the specified pressure, and in the first phase. The method further comprises using the thermodynamic property associated with the first phase and the thermodynamic pseudo-property associated with the second phase to simulate a thermodynamic process.

In an embodiment, a computer program product for a thermodynamic modeling system is disclosed. The computer program product comprises a computer readable storage medium having a computer usable program code embodied therein. The computer usable program code determines a value of a tangent hyperplane distance function $D(\alpha)$ defined on a composition domain of $\alpha$ having k dimensions, where $1 \leq k < n$, for a material mixture having a composition $\bar{z}$ comprised of n components having a mole fraction $\{z_1, z_2, \ldots, z_n\}$. The computer usable program code further evaluates a phase stability of the material mixture, where the material mixture is determined to be susceptible to a phase split when $D(\alpha)<0$.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
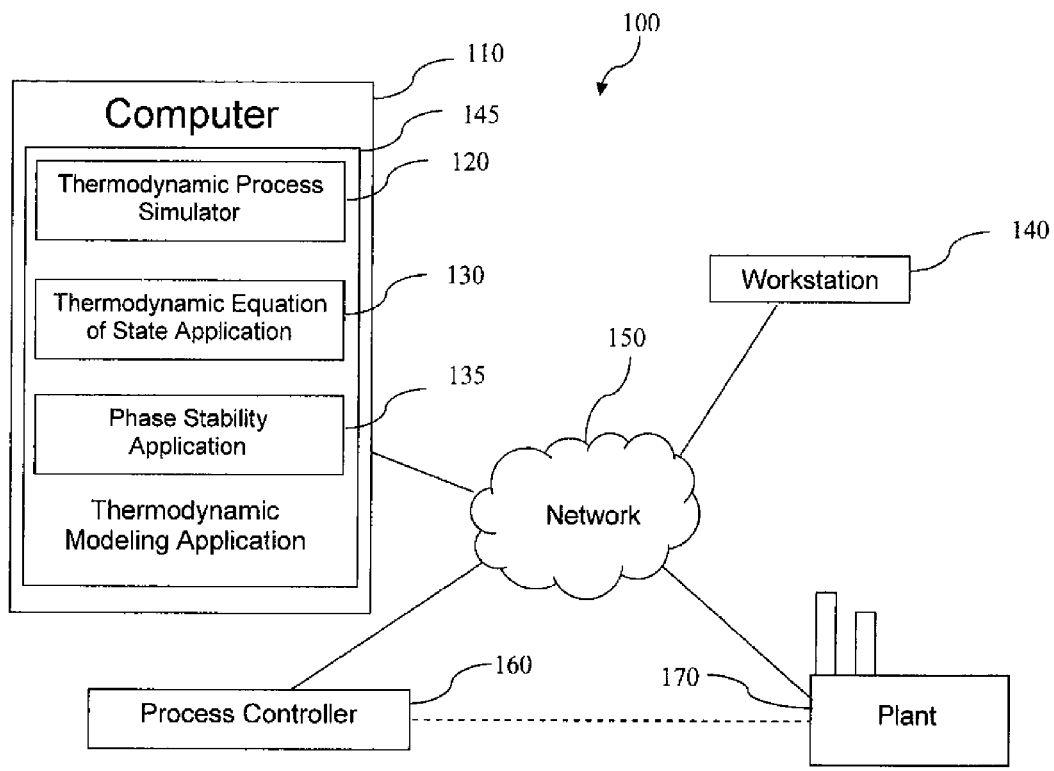
FIG. 1 illustrates a system suitable for implementing several embodiments of the disclosure.

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents.

The present disclosure teaches a system and method for modeling and controlling thermodynamic systems. The method can be executed on a computer to calculate and thereby simulate the characteristics of thermodynamic systems. In an embodiment, the method may comprise determining pseudo-properties over a portion of the range of an independent variable of an equation of state. For further details about determining pseudo-properties, see U.S. patent application Ser. No. 12/547,145 entitled "Thermodynamic Process Control Based on Pseudo-density Root for Equation of State," by Gang Xu, et al., filed Aug. 25, 2009, which is hereby incorporated by reference. In an embodiment, the method also comprises determining whether the value of a tangent hyperplane distance function $D(\alpha)$ has a negative value for any values of $\alpha$. $D(\alpha)$ can be defined in terms of Gibbs energy in a composition domain having k dimensions, where $1 \leq k < n$ for a material mixture of composition $\bar{z}$ comprised of n components $\{z_1, z_2, \ldots, z_n\}$, and evaluating a phase stability of the material mixture, where the material mixture is determined to be susceptible to a phase split when $D(\alpha)<0$. Alternatively, in an embodiment, the method may comprise determining whether the hyperplane tangent to the delta Gibbs energy function of a material composition assumed to be in a first phase has one or more points of intersection with the delta Gibbs energy function of the material composition hypothetically in a second phase.

In an embodiment, the method comprises a reduction of the number of variables utilized in calculations for generating the thermodynamic model, thereby efficiently producing the result. Whereas known thermodynamic modeling systems may encounter conditions in which calculations involve protracted computation time such that their practical utility is reduced, or wherein known thermodynamic modeling systems may fail to produce appropriate models when encountering discontinuous functions, the system and method taught herein addresses these conditions with solutions that attenuate the susceptibility to such problems.

For example, in a complex mixture of components, as in a hydrocarbon stream of a refining process, the number of components may reach hundreds, thousands, or more. When calculations are undertaken in order to determine flash conditions and/or phase behavior of systems with this many components, computations employing traditional methods may be time consuming and may in some circumstances be virtually intractable. By contrast, the system and methods of the present disclosure may reduce the processing time of a phase equilibrium determination from hours to milliseconds.

Turning now to FIG. 1, a system 100 for generating models that simulate and control physical characteristics of a thermodynamic system is described. In an embodiment, a computer 110 includes a memory that stores and a processor that invokes a thermodynamic process simulation application 120, a thermodynamic equation of state application 130, and a phase stability application 135. The thermodynamic process simulation application 120, the thermodynamic equation of state application 130, and the phase stability application 135 comprise the thermodynamic modeling application 145, all of which may be stored in the memory and/or secondary storage of the computer 110. Computers are discussed in more detail hereinafter. In an embodiment, other thermodynamics applications may be stored in the memory and/or secondary storage of the computer 110 and executed by the processor of the computer 110. The thermodynamic modeling application 145 may generate a thermodynamic model and output calculated values and/or process control values that can be used, for example, to control a thermodynamic process in a plant, train an operator of the thermodynamic process or plant, and/or predict a behavior of a thermodynamic process or component.

In an embodiment, the computer 110 may receive measurements and/or indications of thermodynamic variables from a plant 170 via a network 150. In an embodiment, the computer 110 may receive measurements of thermodynamic variables from a plant 170 via a network 150, for example from sensors coupled to components in the plant 170 such as chambers of a fractionation tower and/or a distillation tower. Sensors of thermodynamic variables may include temperature sensors, pressure sensors, and the like.

The network 150 may be provided by any of a local area network, a public switched telephone network (PSTN), a public data network (PDN), and a combination thereof. Portions of the network 150 may be provided by wired connections and/or links while other portions of the network 150 may be provided by wireless connections and/or links. Based on the values of the thermodynamic variables, the computer 110 may invoke the thermodynamic process simulation application 120 to determine control and/or command values. The computer 110 may then transmit the control and/or command values via the network 150 to a process controller 160, where the process controller 160 is coupled to the plant 170 and/or a thermodynamic process component in the plant 170 via network 150. The process controller 160 may control the plant 170 and/or one or more thermodynamic process components in the plant 170 based on the control and/or command values received from the computer 110.

The system 100 may further comprise a workstation 140 that may provide a user interface for an operator to interact with the computer 110 and/or the thermodynamic modeling application 145. In an embodiment, a trainee may use the workstation 140, in association with the computer 110 and the thermodynamic modeling application 145, to simulate a variety of virtual events associated with the plant 170, for example a motor tripping off line, and the result of the trainee's response to the virtual event in the simulated behavior of the plant 170. This may permit trainees to learn valuable plant management lessons in a safe and consequence-free environment.

In addition, a manager of the plant 170 may use the workstation 140 to model the operation of a variety of thermodynamic process components of the plant 170 at different operating points, to analyze advantages and disadvantages associated with operating the plant 170 at these operating points. For example, modeling a parameter change to a process may indicate whether or not the resulting process change could lead to increased material throughput or improved material quality.

In an embodiment, the computer 110 may invoke the thermodynamic modeling application 145, and the thermodynamic modeling application 145 may determine the likelihood or probability that a material mixture may be split into at least two phases. This determination may be based on evaluating an equation $\theta(\bar{x})$ at a specified temperature, a specified pressure, and having a feed composition $\bar{z}$ in a phase A, expressed as a mole fraction, comprised of n components $\{z_1, z_2, \ldots, z_n\}$:

$$D = g_{mix,2}(\bar{x}) - \left[ g_{mix,1}(\bar{z}) + \sum_{i=1}^{n} (x_i - z_i) \frac{\partial g_{mix,1}}{\partial z_1} \right] \theta(\bar{x})$$

In equation $\theta(\bar{x})$, $\bar{x}$ is comprised of variables $\{x_1, x_2, \ldots, x_n\}$ and represents the mole fraction of the components of the mixture that hypothetically are in a phase B, subject to the constraint that each $x_i \geq 0$ and $$1 = \sum_{i=1}^{n} x_i.$$

In an embodiment, when $\theta(\bar{x})$ is evaluated across a range of $\bar{x}$, if D has a negative value for some value of $\bar{x} \neq \bar{z}$, the material mixture is likely to be split into at least two phases, for example split into phase A and phase B. In an embodiment, equation $\theta(\bar{x})$ may preferably be evaluated based on evaluating an equation $\Psi(\alpha)$ that is based on the equation $\theta(\bar{x})$, as discussed further hereinafter.

Figure 2:
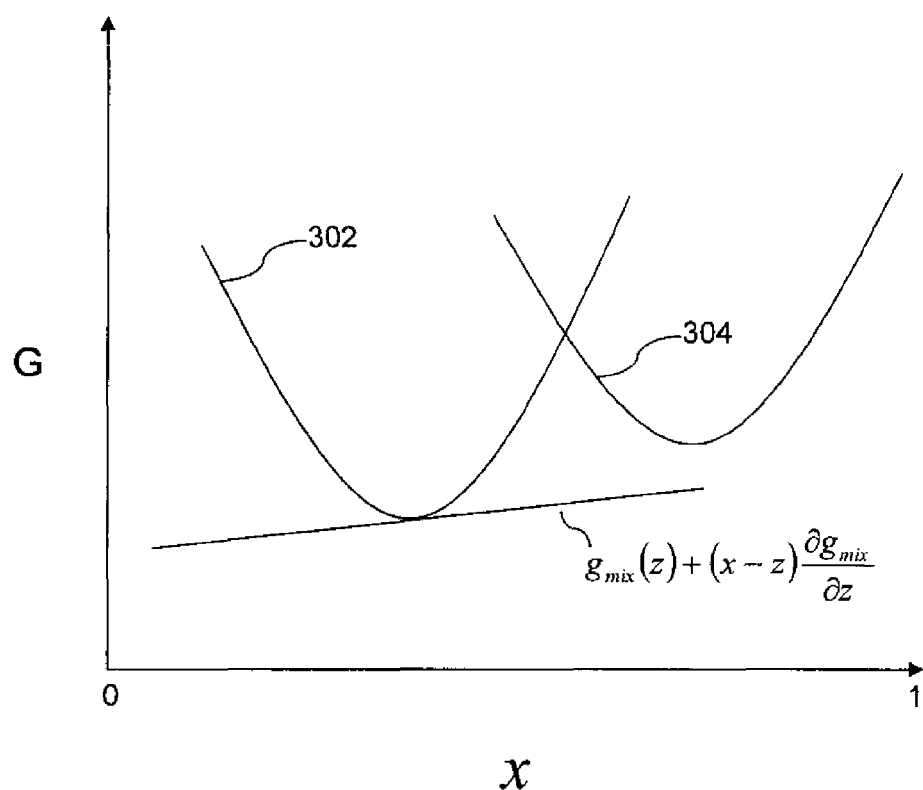
FIG. 2 is an illustration of an exemplary Gibbs energy of mixing function according to an embodiment of the disclosure.

Turning now to FIG. 2, a Gibbs energy of mixing function associated with phase A is represented as curve 302 and a Gibbs energy of mixing function associated with phase B is represented as curve 304. For example, phase A may be one of solid, liquid, or vapor, and phase B may also be one of solid, liquid, or vapor, but phase A and phase B are not the same in a given system. In an embodiment, the Gibbs energy of mixing of phase A and the Gibbs energy of mixing of phase B may be determined, at least in part, based on thermodynamic pseudo-properties.

In an embodiment, the thermodynamic process simulation application 120 may iteratively invoke the thermodynamic equation of state application 130 to determine a thermodynamic result, for example a density. As known to those skilled in the art, the thermodynamic process simulation application 120 may invoke the thermodynamic equation of state application 130 with specified values that deviate from feasible thermodynamic state values, for example while the thermodynamic process simulation application 120 is in the process of converging on a consistent solution of thermodynamic state for a thermodynamic system, volume, and/or process. In an embodiment, the thermodynamic equation of state application 130 may return pseudo-properties when invoked with infeasible values. In an embodiment, it may be desirable that the pseudo-properties returned by the thermodynamic equation of state application 130 promote convergence of the solution sought by the thermodynamic process simulation application 120.

Some equations of state may have a form $P = EOS(T, \bar{z}, \rho)$, where $EOS(\ )$ represents the subject equation of state, where P represents pressure, T represents temperature, $\bar{z}$ represents a mole fraction composition of a material mixture that is the subject of the thermodynamic analysis, for example a mixture of ethane, butane, methane, and other hydrocarbons, and ρ is the density of the material. In an embodiment, determining the properties of state of the material mixture entails the thermodynamic equation of state application 130 identifying a first departure point and a second departure point from a curve of pressure versus density at a constant temperature and for a given material composition. The first departure point is associated with a first phase of the material mixture and the second departure point is associated with a second phase of the material mixture. In an embodiment, determining the properties of state of the material mixture also entails the thermodynamic equation of state application 130 identifying a first extrapolation equation associated with the first phase of the material mixture and a second extrapolation equation associated with the second phase of the material mixture. When the thermodynamic equation of state application 130 is invoked for a material mixture in the first phase at a specified pressure lower than the pressure at the first departure point, the first extrapolation equation is used to determine a pseudo-density property. When the thermodynamic equation of state application 130 is invoked for a material mixture in the second phase at a specified pressure higher than the pressure at the second departure point, the second extrapolation equation is used to determine the pseudo-density property. In an embodiment, the first departure point ($\rho_{dp1}$, $P_{dp1}$) is determined based on the equation $$\frac{\partial P}{\partial \rho} \propto \frac{P}{\rho}.$$

In an embodiment, the second departure point ($\rho_{dp2}$, $P_{dp2}$) is determined based on the equation $$\frac{\partial P}{\partial \rho} = R,$$

where R is the universal gas constant. In an embodiment, the first extrapolation equation has the form $P=P_{dp1}+b(\rho-\rho_{dp1})+c(\rho-\rho_{dp1})^2$, where b and c are constants. In an embodiment, the second extrapolation equation has the form $P=f(\rho)$, where $f(\rho)$ is quadratic in ρ and where $f(\rho)$ asymptotically approaches the equation of state as P increases. As known to those skilled in the art, computer solutions for quadratic functions are generally more efficient than computer solutions for logarithmic functions, hence the two extrapolation equations identified above may promote improved computational efficiency when determining thermodynamic properties versus other known extrapolation equations. For further details on determining thermodynamic pseudo-properties, see "Thermodynamic Process Control Based on Pseudo-density Root for Equation of State," by Gang Xu, et al., which was incorporated by reference above.

Gibbs energy represents the thermodynamic potential energy of a system, and is given by the equation G=U+PV−TS, where U is internal energy, P is pressure, V is volume, T is temperature, and S is entropy. The Gibbs energy of mixing $g_{mix}(\bar{c})$ is the Gibbs energy resulting from mixing multiple components of a composition, where $\bar{c}=\{c_1, c_2, \ldots, c_n\}$ is the mole fraction of the subject composition, and is based on the relative Gibbs energy of each of the components in the mixture. For example, the Gibbs energy of mixing may be given by the equation $$g_{mix}(\bar{c}) = \sum_{i=1}^{n} c_i \ln \phi_i + \sum_{i=1}^{n} c_i \ln c_i$$

where $\phi_i$ is the fugacity coefficient associated with the i-th component of the subject composition. The fugacity coefficient of a substance is related to the fugacity of the substance. Fugacity is a property of a substance that depends upon pressure, temperature, and phase. Fugacity is discussed further hereinafter. For purposes of illustration, the Gibbs energy of mixing of phase A and the Gibbs energy of mixing of phase B illustrated in FIG. 2 are plotted for a mixture understood to be at a constant temperature T and at a constant pressure P. It is understood that at other operating points having different temperature T and/or different pressure P, the Gibbs energy of mixing may have different values for the same mole fraction of material mixture components.

In an embodiment, it is first determined whether the Gibbs energy of mixing of phase A at feed mixture $\bar{z}$ is less than the Gibbs energy of mixing of phase B at the feed mixture $\bar{z}$. If the Gibbs energy of mixing of phase A at feed mixture $\bar{z}$ is less than the Gibbs energy of mixing of phase B at the feed mixture $\bar{z}$, then in equation $$\theta(\bar{x}), g_{mix,1}(\bar{z}) \text{ and } \frac{\partial g_{mix,1}}{\partial z_1}$$

are determined based on the Gibbs energy of mixing associated with phase A of the mixture (e.g., curve 302), and $g_{mix,2}(\bar{x})$ is determined based on the Gibbs energy of mixing associated with phase B (e.g., curve 304). On the other hand, if the Gibbs energy of mixing of phase B at feed mixture $\bar{z}$ is less than the Gibbs energy of mixing of phase A at the feed mixture $\bar{z}$, then in equation $$\theta(\bar{x}), g_{mix,1}(\bar{z}) \text{ and } \frac{\partial g_{mix,1}}{\partial z_1}$$

are determined based on the Gibbs energy of mixing associated with phase B of the mixture (e.g., curve 304) and $g_{mix,2}(\bar{x})$ is determined based on the Gibbs energy of mixing associated with phase A (e.g., curve 302).

When n=2, equation $\theta(\bar{x})$ becomes $$D(\bar{x}) = g_{mix,2}(\bar{x}) - \left[g_{mix,1}(\bar{z}) + (x_1-z_1)\frac{\partial g_{mix,1}}{\partial z_1} + (x_2-z_2)\frac{\partial g_{mix,1}}{\partial z_2}\right].$$

In this form of the equation $$\theta(x), \text{ the term } \left[g_{mix,1}(\bar{z}) + (x_1-z_1)\frac{\partial g_{mix,1}}{\partial z_1} + (x_2-z_2)\frac{\partial g_{mix,1}}{\partial z_2}\right]$$

may be understood to define the equation of a line tangent to the curve of the appropriate Gibbs energy of mixing function (e.g., curve 302 in the present example) at the feed mixture $\bar{z}$, where the equation of the line is in point-slope equation form, with the slope defined by $$\frac{\partial g_{mix,1}}{\partial z}.$$

Thus, D corresponds to the vertical distance between the line tangent to the curve of the Gibbs energy of mixing function of phase A at z and the Gibbs energy of mixing function of phase B at the subject value of $\bar{x}$. If at any value of $\bar{x}$ the curve of the Gibbs energy of mixing function of phase B is below the line tangent to the curve of the Gibbs energy of mixing function of phase A at $\bar{z}$, where D has a negative value, the mixture is likely to be split between phase A and phase B.

When n=3, the term $$\left[ g_{mix,1}(\bar{z}) + \sum_{i=1}^{3} (x_t - z_t) \frac{\partial g_{mix,1}}{\partial z_t} \right]$$

may be understood to define an equation of a plane tangent to the appropriate Gibbs energy of mixing function (e.g., the Gibbs energy of mixing function associated with phase A in the current example). When n=3, D corresponds to the vertical distance between the plane tangent to the surface of the appropriate Gibbs energy of mixing function (e.g., the Gibbs energy of mixing function associated with phase A in the current example) at the feed mixture $\bar{z}$ and the Gibbs energy of mixing function of phase B at the subject value of $\bar{x}$. If at any value of $\bar{x}$ the curve of the Gibbs energy of mixing function of phase B is below the line tangent to the curve of the Gibbs energy of mixing function of phase A at $\bar{z}$, where D has a negative value, the mixture is likely to be split between phase A and phase B. When n>3, the term $$\left[ g_{mix,1}(\bar{z}) + \sum_{i=1}^{n} (x_t - z_t) \frac{\partial g_{mix,1}}{\partial z_t} \right]$$

may be difficult to visualize in geometric terms, as it is expressed in more than three dimensions, however the mathematical analysis is substantially similar. Generalizing for n>1, the equation $$\theta(\bar{x}) \left[ g_{mix,1}(\bar{z}) + \sum_{i=1}^{n-1} (x_t = z_t) \frac{\partial g_{mix,1}}{\partial z_t} \right]$$

may be said to define an equation of a hyperplane tangent to the appropriate Gibbs energy of mixing function (e.g, the Gibbs energy of mixing function associated with phase A in the current example). As is appreciated by one skilled in the art, the term hyperplane generalizes the concept of a plane into a different number of dimensions and may be said to define a d-dimensional subspace in an e-dimensional space, where d<e. For example, a line is a one-dimensional hyperplane in a space of two or more dimensions.

Under some mathematical assumptions, $\bar{x}$ may be considered to comprise n−1 free variables because the constraint that the n variables of $\bar{x}$ sum to a value of unity, 1, means that once the values of the first n−1 mole fractions of $\bar{x}$ are specified, then the n-th mole fraction of $\bar{x}$ is determined. Under this mathematical assumption, the equation of the hyperplane tangent may be modified to $$\left[ g_{mix,1}(\bar{z}) + \sum_{i=1}^{n-1} (x_t - z_t) \frac{\partial g_{mix,1}}{\partial z_t} \right].$$

The first expression for the equation of the hyperplane tangent as set forth above may be the customary expression employed in the analysis of thermodynamic processes, but in combination with the present disclosure those skilled in the art may choose to use either the equation of the hyperplane tangent that iterates across n components or the equation of the hyperplane tangent that iterates across n−1 components.

It will be appreciated that explicitly evaluating equation $\theta(\bar{x})$ becomes very challenging when the subject mixture comprises numerous components, as may be the case when analyzing and/or modeling a stream of hydrocarbons in a refining process. It is a teaching of the present disclosure that the equation $\Psi(\alpha)$, where $\alpha$ is of a lower order than $\bar{x}$, may be evaluated to determine the likelihood that the subject mixture is split into more than one phase. Further, if $\Psi(\alpha)$ evaluates to a negative value for any value of $\alpha$, this value of $\alpha$ may be used to determine an effective estimation of the mole fraction $\bar{x}$ of the second phase, for example the mole fraction $\bar{x}$ of phase B, without explicitly determining the value of $\alpha$ that minimizes $\Psi(\alpha)$. Alternatively, in another embodiment, a value $\alpha_{min}$ that minimizes $\Psi(\alpha)$ is solved for, and the $\alpha_{min}$ may be used to determine an effective estimation of the mole fraction $\bar{x}$ of the second phase. Note that the value $\alpha_{min}$ that locates a minimum or local minimum of $\Psi(\alpha)$, including when $\Psi(\alpha)$ evaluates to a positive value, may be used to determine an effective estimation of the mole fraction $\bar{x}$ of the second phase. Various global techniques may be employed for finding local minima of $\Psi(\alpha)$ including interval analysis techniques, branch and bound techniques, and/or other analysis techniques.

In an embodiment, the computer 110 invokes the thermodynamic modeling application 145, and the thermodynamic modeling application 145 may estimate the likelihood that a material mixture at a specified temperature, a specified pressure, and having a feed composition $\bar{z}$ comprised of n components $\{z_1, z_2, \ldots, z_n\}$ is split into at least two phases based on evaluating an equation $\Psi(\alpha)$ to determine if D has a negative value for some value of $\alpha \neq \alpha_z$, where $$\alpha_z = \sum_{i=1}^{n} z_t \ln \phi_t^z \text{ and } \phi_t^z$$

is the fugacity coefficient of the i-th component $z_i$ in the phase associated with the feed composition $\bar{z}_i$, for example in phase A. Note that the superscript z in $\phi_i^z$ should not be confused with a power of exponentiation.

In an embodiment, the value of $\alpha$ may be varied over the range of $\alpha_z - 10 \le \alpha \le \alpha_z + 10$. Alternatively, in another embodiment, the value of $\alpha$ may be varied over the range of $\alpha_z - 5 \le \alpha \le \alpha_z + 5$. Alternatively, in another embodiment, the value of $\alpha$ may be varied over the range of $\alpha_z - 20 \le \alpha \le \alpha_z + 20$. Alternatively, in another embodiment, the value of $\alpha$ may be varied over the range of $\alpha_z - 50 \le \alpha \le \alpha_z + 50$. Alternatively, in another embodiment, the value of value of $\alpha$ may varied over a different range. In an embodiment, the value of $\alpha$ may be varied in increments of about 0.001, increments of about 0.01, increments of about 0.1, increments of about 1.0, or in a different increment. In an embodiment, the value of $\alpha$ may be varied in different increments over the range.

If D has a negative value for any value of $\alpha \neq \alpha_z$, it is likely that the subject mixture is split into two phases, for example into a phase A and a phase B, and the value of $\alpha$ may be used to determine an effective estimate of the mole fraction $\bar{x}$ of the other phase, for example phase B. In an embodiment, the equation $\Psi(\alpha)$ may be implemented in various forms suitable for execution on a computer processor. In one abstract mathematical representation, equation $\Psi(\alpha)$ can be expressed in the notational form given below. Those of skill in the art will readily appreciate that the equation $\Psi(\alpha)$ may be represented in various forms and using various notational conventions which may vary somewhat from the form given below.

$$D(\alpha) = \alpha + \sum_{i=1}^{n} f_i(\alpha) \ln[f_i(\alpha)] - g_{mix,1}(\bar{z}) - \sum_{i=1}^{n} \{f_i(\alpha) - z_i\} \frac{\partial g_{mix,1}}{\partial \alpha_z} \quad (\Psi(\alpha))$$

In $\Psi(\alpha)$, $\alpha$ is a scalar variable, and $\alpha_z$ is a value of $\alpha$ corresponding to the specified feed composition $\bar{z}$. In $\Psi(\alpha)$, $g_{mix,1}(\bar{z})$ is the Gibbs energy of mixing function at the specified temperature and specified pressure for the appropriate phase, for example phase A, as discussed further above. In an embodiment, $g_{mix,1}(\bar{z})$ may be determined based on pseudo-properties derived from an extrapolated thermodynamic equation of state. In $\Psi(\alpha)$, $f_i(\alpha_z) = z_i$, and $f_i(\alpha)$ is determined as a Taylor Series approximation of $m^{th}$ order which may be of the form $$\sum_{j=0}^{m} f_i^J(\alpha_z) \frac{(\alpha - \alpha_z)^J}{j!},$$

where m is an integer. In $$\Psi(\alpha), \frac{\partial g_{mix,1}}{\partial \alpha_z} \propto \frac{\partial g_{mix,1}}{\partial z_t} \frac{\partial z_t}{\partial \alpha_z}.$$

In a preferred embodiment, m=1, but in other embodiments, higher values of m may be employed.

As stated above, when D has a negative value at some value of $\alpha$, the subject mixture is likely to be split into at least two phases, for example split into a phase A and a phase B, and $\alpha$ provides an estimate of the mole fraction $\bar{x}$ of the portion of the subject mixture split into the other phase, for example into phase B. In an embodiment using a first order Taylor Series approximation, $\bar{x}$ may be estimated based on $\alpha$ using the relation $x_i = f_i(\alpha)$ where $$f_1(\alpha) = z_1 + (\alpha - \alpha_z) \frac{1}{\ln \phi_i^z},$$

and $\phi_i^z$ is the fugacity coefficient of the $i^{th}$ mixture component at the specified temperature, the specified pressure, and in the phase of the specified composition $\bar{z}$, for example phase A. In an embodiment, the substitution $$\sum_{i=2}^{n} (x_t - z_t) \frac{\partial g_{mix}}{\partial z_t} = (\alpha - \alpha_z) \frac{\partial g_{mix}}{\partial \alpha_z}$$

is used, which may comprise some approximation, to simplify $\Psi(\alpha)$ somewhat to:

$$D(\alpha) = \alpha + \sum_{i=1}^{n} f_i(\alpha) \ln[f_i(\alpha)] - g_{mix,1}(\bar{z}) - (\alpha - \alpha_z) \frac{\partial g_{mix,1}}{\partial \alpha_z} \quad \Psi(\alpha)$$

In an embodiment using a second order Taylor Series approximation, $\bar{x}$ may be estimated based on $\alpha$ using the relation $x_i = f_i(\alpha)$ where $$f_1(\alpha) = z - t + (\alpha - \alpha_z) \frac{1}{\ln \phi_1^z} + \frac{(\alpha - \alpha_z)^2}{2!} \frac{\partial^2 z_1}{\partial \alpha^2}, \text{ and } \phi_1^z$$

is the fugacity coefficient of the $i^{th}$ mixture component at the specified temperature, the specified pressure, and in the phase of the specified composition $\bar{z}$, for example phase A. The first order Taylor Series approximation may be considered to be equivalent to the second order Taylor Series approximation where the second order term is truncated. When D does not have a negative value at any value of $\alpha$, the subject mixture is probably in a stable single phase, for example in phase A.

In an embodiment, the summation of the n components $x_i$ determined as described above may not sum to unity, 1, for example due to approximation errors associated with the truncated terms of the Taylors Series. In an embodiment, the value of each of the n components $x_i$ may be normalized by determining $$x_t = \frac{x_t'}{\sum_{i=1}^{n} x_t'}$$

where $x'_i = f_i(\alpha)$. In some embodiments, the error associated with omitting normalization may be acceptable. In other embodiments, the error associated with omitting normalization may not be acceptable and may be worth the additional normalization calculation. In some contexts the relationship between the n components $x_i$ and $\alpha$ may be represented as $x_i \propto f_i(\alpha)$, a proportional relationship.

Fugacity is a measure of chemical potential and may be said to represent the tendency of a substance to exist in one phase over another. At a given temperature and pressure, a substance may have a different fugacity for each phase, and the phase with the lowest fugacity may be most stable, and will also have the lowest Gibbs energy. A fugacity coefficient, in an embodiment, may be substantially equal to fugacity divided by pressure. Fugacity coefficients may be looked-up from standard tabulations of fundamental data and may be stored in data tables or look-up tables in memory accessible by the phase stability application 135. The value of fugacity coefficient of a component of the material mixture in a specific state may be determined by extrapolating between data points stored in the fugacity coefficient look-up table using any of a variety of extrapolation methods known to those skilled in the art, including, but not limited to, linear extrapolation, polynomial extrapolation, conic extrapolation, French curve extrapolation, and other extrapolation methods. In an embodiment, the value of the fugacity coefficient in a specific state of a component of the material mixture may be determined from an equation.

In an embodiment, it is not necessary that the function $f_i(\alpha)$ be specified or known. By virtue of stating the function in terms of a single variable $\alpha$, the Taylor Series expansion can provide a sufficient approximation of $f_i(\alpha)$ to determine the material mixture's susceptibility to phase splitting under the thermodynamic conditions being modeled, for example quasi-equilibrium, a metastable state, and/or supersaturation.

When a value of $\alpha$ is found where $\Psi(\alpha)$ has a negative value, the material mixture is susceptible to a phase split—to exist in at least two phases—and a vector $\bar{x}$ may be obtained from $$x_i \propto \left[z_i + (\alpha - \alpha_i)\frac{1}{\ln \phi_i^z}\right].$$

$\bar{x}$ may be used to estimate and/or approximate the mole fraction of the material mixture in the other phase, for example phase B, of the material mixture. Note that the value of $\alpha$ that minimizes $\Psi(\alpha)$, even when a positive value, may be used to find $\bar{x}$ for use to estimate and/or approximate the mole fraction of the material mixture in the other phase.

An example of using equation $\Psi(\alpha)$ will now be briefly described. Given a feed composition $\bar{z}$, $\alpha_z$ is found as $$\alpha_z = \sum_{i=1}^{n} z_i \ln \phi_i^z,$$

where $\phi_i^z$ is the fugacity coefficient of the i-th component $z_i$ at a specified temperature, a specified pressure, and in a specified phase, for example phase A. Using the values $\bar{z}=\{z_1, z_2, \ldots, z_n\}$ and $\alpha_z$, the scalar value of $\alpha$ is varied across a range to find if D<0 for any value of $\alpha$. If D≥0 for all values of $\alpha$, then the mixture is determined to likely be in a single phase, for example in phase A. If, however, D<0 for any value of $\alpha$, then mixture is determined to likely be in a split phase, in both phase A and in phase B, and this value of $\alpha$ may be used to estimate the mole fraction of the split phase, for example the portion of the mixture in phase B. In this case, $\bar{x}=\{x_1, x_2, \ldots, x_n\}$ may be determined from successively applying the relation $$x_i \propto \left[z_i + (\alpha - \alpha_i)\frac{1}{\ln \phi_i^z}\right]$$

for each of the n components. This value of $\bar{x}$ may then be used as an initial estimate of the mole fraction of the mixture in phase B. In an alternative embodiment, if D<0 for any value of $\alpha$, the value of $\alpha_{min}$ is found that minimizes D, and $\alpha_{min}$ is used to find $\bar{x}=\{x_1, x_2, \ldots, x_n\}$ by successively applying the relation $$x_i \propto \left[z_i + (\alpha - \alpha_i)\frac{1}{\ln \phi_i^z}\right].$$

In some circumstances, the additional accuracy associated with using $\alpha_{min}$ to find $\bar{x}=\{x_1, x_2, \ldots, x_n\}$ may justify the additional computational effort to find $\alpha_{min}$; in other circumstances, however, the additional accuracy may not be needed or may not be worth the additional computational effort.

As known to those skilled in the art, reducing the number of variables utilized in this and similar calculations may reduce the computational difficulty and/or complexity, thereby reducing the demands on the computer 110 and the time needed to produce the result. For example, reducing the calculation from an equation with one hundred components $\{x_1, x_2, \ldots, x_{100}\}$, to an equation with a single variable $\alpha$, as described above, may reduce the processing time to predict phase stability from hours to milliseconds. While using the method above of evaluating the equation $\Psi(\alpha)$ in the scalar variable $\alpha$ may provide the greatest reductions of computational difficulties, one skilled in the art will readily appreciate that this approach can be employed to advantage based on using a variable in two or more dimensions, for example m dimensions where 1<m<n.

Figure 3:
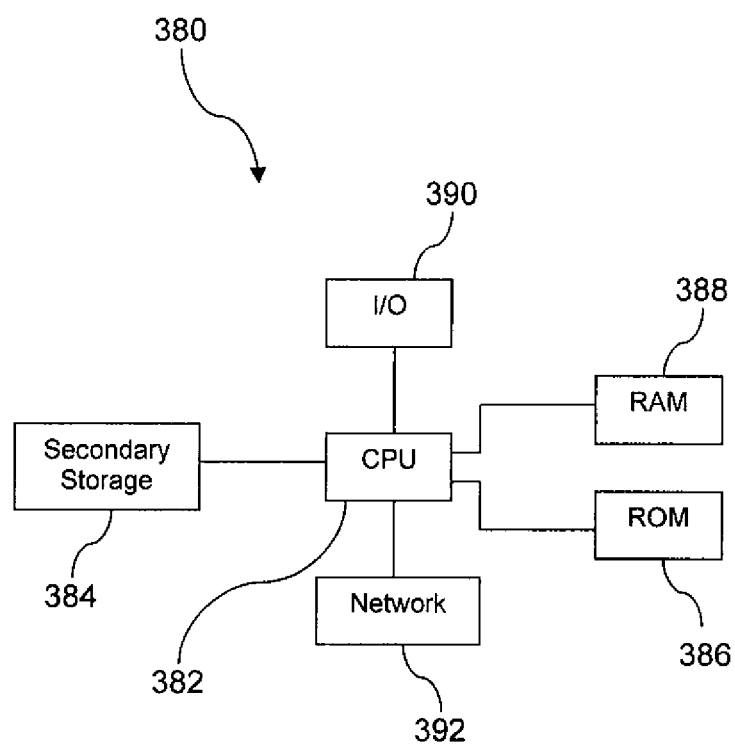
FIG. 3 is an illustration of a computer system according to an embodiment of the disclosure.

FIG. 3 illustrates a computer system 380 suitable for implementing the computer 110 described above. The computer system 380 includes a processor 382 (which may be referred to as a central processor unit or CPU) that is in communication with memory devices including secondary storage 384, read only memory (ROM) 386, random access memory (RAM) 388, input/output (I/O) devices 390, and network connectivity devices 392. The processor 382 may be implemented as one or more CPU chips.

It is understood that by programming and/or loading executable instructions onto the computer system 380, at least one of the CPU 382, the RAM 388, and the ROM 386 are changed, transforming the computer system 380 in part into a particular machine or apparatus having the novel functionality taught by the present disclosure. It is fundamental to the electrical engineering and software engineering arts that functionality that can be implemented by loading executable software into a computer can be converted to a hardware implementation by well known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

The secondary storage 384 is typically comprised of one or more disk drives or tape drives and is used for non-volatile storage of data and as an over-flow data storage device if RAM 388 is not large enough to hold all working data. Secondary storage 384 may be used to store programs which are loaded into RAM 388 when such programs are selected for execution. The ROM 386 is used to store instructions and perhaps data which are read during program execution. ROM 386 is a non-volatile memory device which typically has a small memory capacity relative to the larger memory capacity of secondary storage 384. The RAM 388 is used to store volatile data and perhaps to store instructions. Access to both ROM 386 and RAM 388 is typically faster than to secondary storage 384.

I/O devices 390 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 392 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. These network connectivity devices 392 may enable the processor 382 to communicate with an Internet or one or more intranets. With such a network connection, it is contemplated that the processor 382 might receive information from the network, or might output information to the network in the course of performing the above-described method steps. Such information, which is often represented as a sequence of instructions to be executed using processor 382, may be received from and outputted to the network, for example, in the form of a computer data signal embodied in a carrier wave.

Such information, which may include data or instructions to be executed using processor 382 for example, may be received from and outputted to the network, for example, in the form of a computer data baseband signal or signal embodied in a carrier wave. The baseband signal or signal embodied in the carrier wave generated by the network connectivity devices 392 may propagate in or on the surface of electrical conductors, in coaxial cables, in waveguides, in optical media, for example optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, may be generated according to several methods well known to one skilled in the art.

The processor 382 executes instructions, codes, computer programs, scripts which it accesses from hard disk, floppy disk, optical disk (these various disk based systems may all be considered secondary storage 384), ROM 386, RAM 388, or the network connectivity devices 392. While only one processor 382 is shown, multiple processors may be present. Thus, while instructions may be discussed as executed by a processor, the instructions may be executed simultaneously, serially, or otherwise executed by one or multiple processors.

In an embodiment, some or all of the functionality disclosed above may be provided as a computer program product. The computer program product may comprise one or more computer readable storage medium having computer usable program code embodied therein implementing the functionality disclosed above. The computer program product may comprise data, data structures, files, executable instructions, and other information. The computer program product may be embodied in removable computer storage media and/or non-removable computer storage media. The removable computer readable storage medium may comprise, without limitation, a paper tape, a magnetic tape, magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system 380, at least portions of the contents of the computer program product to the secondary storage 384, to the ROM 386, to the RAM 388, and/or to other non-volatile memory and volatile memory of the computer system 380. The processor 382 may process the executable instructions and/or data in part by directly accessing the computer program product, for example by reading from a CD-ROM disk inserted into a disk drive peripheral of the computer system 380. The computer program product may comprise instructions that promote the loading and/or copying of data, data structures, files, and/or executable instructions to the secondary storage 384, to the ROM 386, to the RAM 388, and/or to other non-volatile memory and volatile memory of the computer system 380.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intent is not to be limited to the details given herein. For example, the various elements or components may be combined or integrated in another system or certain features and formulas may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other examples of changes, substitutions, and alterations are ascertainable by one skilled in the art and could be made without departing from the spirit and scope disclosed herein.

The invention claimed is:
1. A system, comprising:
a computer system;
a memory;
a thermodynamic process simulation application, stored in the memory; and
a thermodynamic equilibrium application, stored in the memory, that, when executed by the computer system, estimates whether a material mixture at a specified temperature, a specified pressure, and having a specified feed composition $\bar{z}$ in a first state comprised of n components having a mole fraction $\{z_1, z_2, \ldots, z_n\}$ is likely to be split into at least two phases based on evaluating a tangent hyperplane distance function in a variable $x=\{x_1, x_2, \ldots, x_n\}$ representing the mole fraction of the material mixture in a second state by reducing the order of the tangent hyperplane distance function by substituting α comprised of from 1 variable to n−1 variables,
wherein the thermodynamic process simulation application executes on the computer system and invokes the thermodynamic equilibrium application to determine a result based on a probability that the material mixture is split into at least two phases determined by the thermodynamic equilibrium application,
wherein the thermodynamic process simulation application executes on the computer system and further determines the probability of phase splitting of mixtures of materials at a given temperature, pressure, and composition by characterizing the functions that describe the system via pseudo-properties and
wherein the system at least one of controls a thermodynamic process, controls a thermodynamic process control component, trains an operator of the thermodynamic process, trains an operator of the thermodynamic process control component, validates a design for the thermodynamic process control component, and predicts the failure time of a process control component based on the result determined by the thermodynamic process simulation application.

2. The system of claim 1, wherein determining the probability that the material mixture is split into at least two phases is based on evaluating an equation ($\Psi(\alpha)$) that is based on the equation ($\theta(\bar{x})$)

$$D = g_{mix}(\bar{x}) - \left[g_{mix}(\bar{z}) + \sum_{i=1}^{n}(x_i - z_i)\frac{\partial g_{mix}}{\partial z_i}\right](\theta(\bar{x}))$$

to determine if D has a negative value for some value of $\bar{x} \neq \bar{z}$, where $g_{mix}(\ )$ is the Gibbs energy of mixing function at the specified temperature and specified pressure, and where equation $\Psi$ is solved based on substituting α comprised of from 1 variable to n−1 variables.

3. The system of claim 2, wherein $$\sum_{i=1}^{n}(x_i - z_i)\frac{\partial g_{mix}}{\partial z_i} = (\alpha - \alpha_z)\frac{\partial g_{mix}}{\partial \alpha_z}.$$

4. The system of claim 2, wherein $$g_{mix}(\bar{z}) \text{ and } \frac{\partial g_{mix}}{\partial z_i}$$

are determined based on the Gibbs energy of mixing function associated with a first phase of the mixture and wherein $g_{mix}(\bar{x})$ is determined based on the Gibbs energy of mixing function associated with a second phase of the mixture.

5. The system of claim 4, wherein the Gibbs energy of mixing function associated with the first phase of the mixture is based on pseudo properties derived from a first extrapolated thermodynamic equation of state associated with the first phase and wherein the Gibbs energy of mixing function associated with the second phase of the mixture is based on pseudo properties derived from a second extrapolated thermodynamic equation of state associated with the second phase.

6. The system of claim 1, wherein the result is at least one of a single-stage flash condition and a distillation condition.

7. The system of claim 1, wherein the mole=$\{x_1, x_2, \ldots, x_n\}$ is subject to the constraint that each $x_i \geq 0$ and $$1 = \sum_{i=1}^{n} xi.$$

8. A system, comprising:
a computer system;
a memory;
a thermodynamic process simulation application, stored in the memory; and
a thermodynamic equilibrium application, stored in the memory, that, when executed by the computer system, estimates a probability that a material mixture at a specified temperature, a specified pressure, and having a specified feed composition $\underline{z}$ comprised of n components having a mole fraction $\{z_1, z_2, \ldots, z_n\}$ is split into at least two phases based on evaluating an equation $\Psi(\alpha)$, where a is a scalar variable, and where $\alpha_z$ is a value of α corresponding to the specified feed composition $\underline{z}$ $$D = \alpha + \sum_{i=1}^{n} f_i(\alpha)\ln[f_i(\alpha)] - g_{mix}(\bar{z}) - \sum_{i=1}^{n}\{f_i(\alpha) - z_i\}\frac{\partial g_{mix}}{\partial \alpha_z}(\Psi(\alpha))$$

to determine if D has a negative value for some value of a $\alpha \neq \alpha_z$,
where $g_{mix}(\ )$ is the Gibbs energy of mixing function at the specified temperature and specified pressure, where $f_j(\alpha_z) = z_j$, where $f_j(\alpha)$ is determined as a Taylor Series approximation of the form $$\sum_{j=0}^{m} f_i^j(\alpha_z)\frac{(\alpha - \alpha_z)^j}{j!},$$

and where m is an integer, and where $$\alpha_z = \sum_{i=1}^{n} z_i \ln \phi_i^z$$

where $\phi_i^z$ is the fugacity coefficient of the i-th component $z_i$ at a specified temperature, a specified pressure, and in a specified phase,
wherein the thermodynamic process simulation application executes on the computer system and invokes the thermodynamic equilibrium application to determine a result based on the probability that the material mixture is split into at least two phases determined by the thermodynamic equilibrium application,
wherein the thermodynamic process simulation application executes on the computer system and invokes the thermodynamic equilibrium application to determine a result based on the probability that the material mixture is split into at least two phases determined by the thermodynamic equilibrium application, and
wherein the system at least one of controls a thermodynamic process, controls a thermodynamic process control component, trains an operator of the thermodynamic process, trains an operator of the thermodynamic process control component, and predicts the failure time of a thermodynamic process control component based on the result determined by the thermodynamic process simulation application.

9. The system of claim 8, wherein $$\frac{\partial g_{mix}}{\partial \alpha_z} = \frac{\partial g_{mix}}{\partial z_i} \frac{\partial z_i}{\partial \alpha_z}.$$

10. The system of claim 8, wherein the Gibbs energy of mixing is based on pseudo properties derived from an extrapolated thermodynamic equation of state.

11. The system of claim 10, wherein when D<0, a provides an estimate of a stable mixture fraction.

12. The system of claim 11, wherein the estimate of the stable mixture fraction, denoted x comprising n components having a mole fraction $\{x_1, x_2, \ldots, x_n\}$, is determined according to the relation $x_i \propto f_i(\alpha)$.

13. The system of claim 11, wherein the estimate of the stable mixture fraction, denoted x comprising n components having a mole fraction $\{x_1, x_2, \ldots, x_n\}$, is determined according to the relation $$x_i \propto \left[ z_i + (\alpha - \alpha_i) \frac{1}{\ln \phi_i^z} \right]$$

where $\Phi_i^z$ is the fugacity coefficient of the i-th mixture component at the specified temperature, at the specified pressure, and in the specified phase.

14. A method, comprising:
a processor determining a value of a tangent hyperplane distance function D(a) defined on a composition domain having k dimensions, where 1≤k<n, for a material mixture having a composition $\bar{z}$ comprised of n components having a mole fraction $\{z_1, z_2, \ldots, z_n\}$ of the material mixture in a first phase, wherein the processor is in communication with a memory, the memory storing a thermodynamic modeling application, and wherein determining the value of the tangent hyperplane distance function is based on the processor executing the thermodynamic modeling application;
the processor evaluating a phase stability of the material mixture, where the material mixture is determined to be susceptible to a phase split when D(a)<0;
determining a thermodynamic property of the material mixture in a first phase from an equation of state of the material mixture in the first phase based at least in part on $\bar{z}$;
when D(α)<0, determining a thermodynamic pseudo-property of the material mixture in a second phase from the equation of state of the material mixture in the second phase based at least in part on a mole fraction $\bar{x}=\{x_1, x_2, \ldots, x_n\}$ of the material mixture in the second phase, using a to determine $\bar{x}=\{x_1, x_2, \ldots, x_n\}$ based on a relation $$x_i \propto \left[ z_i + (\alpha - \alpha_i) \frac{1}{\ln \phi_i^z} \right]$$

where $$\alpha_z = \sum_{i=1}^{n} z_i \ln \phi_i^z$$

and where $\phi_i^x$ is the fugacity coefficient of the i-th mixture component at the specified temperature, at the specified pressure, and in the first phase;
the processor determining a probability of phase splitting of mixtures of materials at a given temperature, pressure, and composition by characterizing the functions that describe the system via pseudo-properties, and
using the thermodynamic property associated with the first phase and the thermodynamic pseudo-property associated with the second phase to simulate a thermodynamic process.

* * * * *